United States Patent [19]
Kusunoki

[11] Patent Number: 5,781,071
[45] Date of Patent: Jul. 14, 1998

[54] TRANSFORMERS AND AMPLIFIERS

[75] Inventor: Shigeo Kusunoki, Kanagawa, Japan

[73] Assignee: Sony Corporation, Japan

[21] Appl. No.: 569,297

[22] Filed: Dec. 8, 1995

[30] Foreign Application Priority Data

Dec. 17, 1994 [JP] Japan ................................ 6-334004
Mar. 27, 1995 [JP] Japan ................................ 7-093051

[51] Int. Cl.$^6$ ........................... H03F 3/26; H01F 27/28
[52] U.S. Cl. ................. 330/269; 330/276; 336/200; 336/232
[58] Field of Search ........................ 330/264, 269, 330/276; 336/200, 232

[56] References Cited

U.S. PATENT DOCUMENTS

| | | | |
|---|---|---|---|
| 4,688,000 | 8/1987 | Donovan ............... | 330/276 X |
| 4,785,345 | 11/1988 | Rawls et al. .......... | 336/232 X |
| 5,095,357 | 3/1992 | Andoh et al. .......... | 336/200 X |
| 5,497,137 | 3/1996 | Fujiki .................... | 336/232 |

FOREIGN PATENT DOCUMENTS

| | | | |
|---|---|---|---|
| 36537 | 2/1993 | Japan ................... | 336/200 |
| 2269057 | 1/1994 | United Kingdom ... | 336/200 |

*Primary Examiner*—James B. Mullins
*Attorney, Agent, or Firm*—Ronald P. Kananen

[57] ABSTRACT

A transformer and an amplifier exhibiting a small lowering in self resonance frequency and having a large mutual inductance. By forming a first flat coil 12A, 31C, 86A, 96A, 102A on the semiconductor substrate surface 11A with the pattern wiring of any conductor and forming a second flat coil 12A, 31A, 31B, 86B, 96B, 102A, 102B along the pattern wiring of the first flat coil 12A, 31C, 86A, 96A, 102A on the insulator layer surface 13A spaced by an insulator layer having a predetermined thickness with the pattern wiring of any conductor, a large mutual conductance can be obtained and further a power amplification based on the class-B push-pull operation can be carried out by forming an amplifier 45, 75, 81 with the aid of a 5-terminal first output transformer 30.

12 Claims, 15 Drawing Sheets

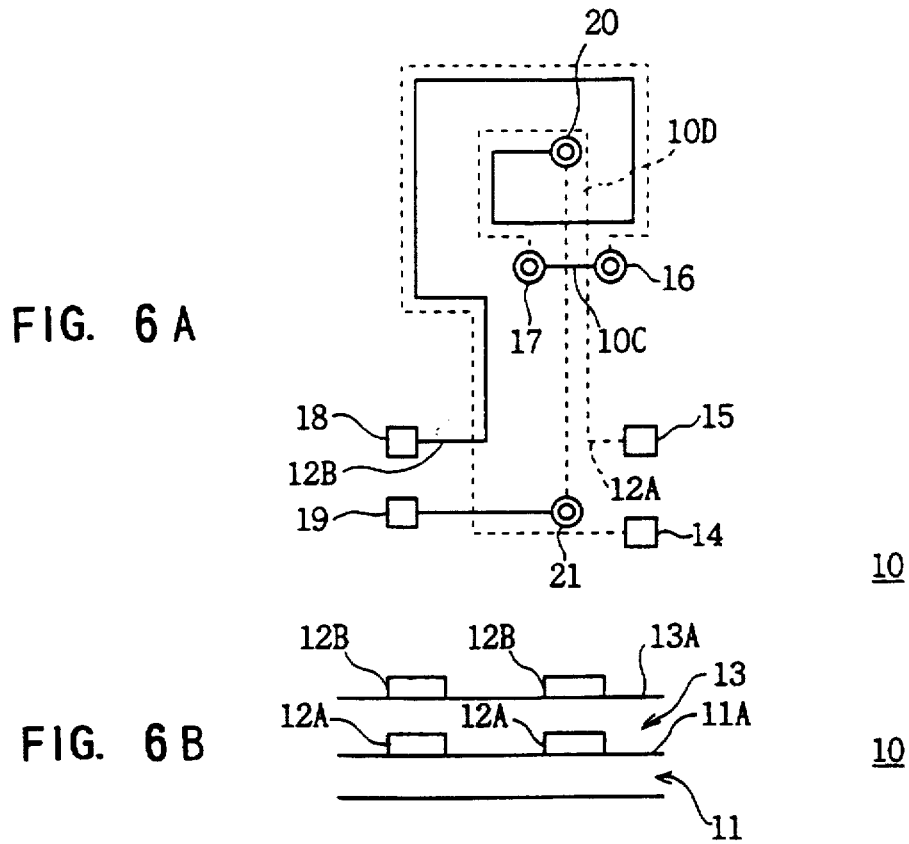
FIG. 6A
FIG. 6B
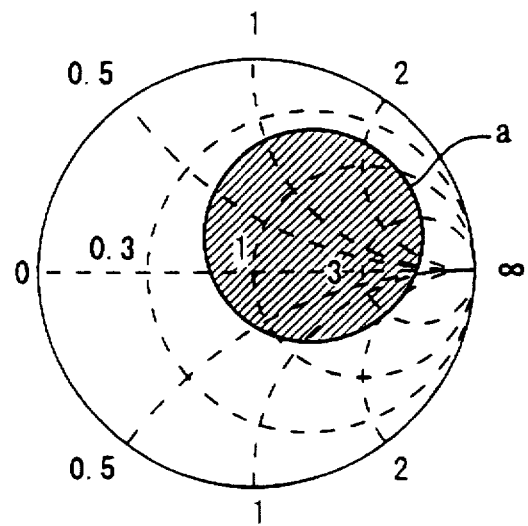
FIG. 7

TRANSFORMERS AND AMPLIFIERS

BACKGROUND OF THE INVENTION

1. Field of the Invention

This invention relates to transformers and-amplifiers, and more particularly, is suitably applicable to transformers and amplifiers formed on a semiconductor device.

2. Description of the Related Art

Nowadays, in land mobile personal communications including car telephone and portable telephone, an increase in number the of subscribers has brought about a shortage of wireless waves of the currently-used frequency band. Accordingly, the start of several new services is decided in succession. These services are mostly digital communications and are mostly using a quasi-microwave band of 0.8 GHz to 2 GHz.

At present, a monolithic microwave integrated circuit (MMIC) available in this frequency band is used. With a mobile communication terminal, because stress is laid principally on portability, the downsizing is indispensable and consequently the IC formation is an important task for electronic parts used therein. Furthermore, as for a portable telephone terminal, a higher current efficiency in the power amplifier to consume the largest quantity of current has become an important technical task for minimizing the consumption of electric batteries.

However, the above new service never fails to require the use of a linear power amplifier and consequently has a limitation in promoting the efficiency. That is, a linear power amplifier in the above frequency band is of single-end type using class-A operation of transistors, so that even the theoretical efficiency of the final stage alone cannot exceed 50% and the total efficiency further including that of the drive stage is 22% at most.

Thus, if a class-B push-pull power amplifier available, even the theoretical efficiency of the final stage alone reaches to 78.5% and its effect can be greatly expected. However, a semiconductor transformer is necessary for IC formation and has not yet been put into practical use.

As one example of prior art, there is, for example, a transformer described in the literature, "Characteristics of vapor-deposition micro-transformer comprising square spiral coils" (1993, General Conference by the Institute of Electrical Engineers of Japan No. 1747). FIGS. 1A and 1B show the constitution thereof. A primary coil 2A and a secondary coil 2B in a transformer 1 of this example are formed by alternately stacking insulating layers and coils between the vertically opposed magnetic layers 3A and 3B. First, an insulating layer 4A is stacked on the lower magnetic layer 3B, next, the secondary coil 2B is formed on the surface thereof, further the primary coil 2A is formed on the insulating layer surface 4B spaced by an insulating layer 4B, and the magnetic layer 3A is formed on the insulating layer 4C stacked thereabove. The primary and secondary coils are both coiled from terminals 2C and 2D inward and are coiled back outward by a half pitch behind after reaching the center.

As a second example, there is a spirally coiled transformer described in the literature, "Coil spacing and characteristics of a spiral type thin film transformer" (1993, General Conference by the Institute of Electrical Engineers of Japan No. 1738). FIGS. 2A and 2B show the constitution thereof. A transformer 6 of this example is made by spirally coiling a primary conductor 8A and a secondary conductor 8B at adjacent lateral positions on the same insulating layer surface 7A in the substrate forming the coils.

The conventional semiconductor transformers mentioned above have the following problems: That is, in the transformer 1 of FIGS. 1A and 1B, the electrical length of mutually adjacent conductors in the primary and secondary coils 2A and 2B is double the electrical length from each fixation point to the center. This is by far longer than the difference in the electrical length of mutually adjacent conductors is one turn for the original model of the respective coils forming the transformer. Accordingly, a critical defect occurs that the self resonance frequency lowers, thereby leading to property deterioration such as an increase in loss for the quasi-microwave band operation.

Furthermore, in the transformer 6 of FIG. 2A because of using a lateral coupling, the coupling force is weaker than that of a vertical coupling. Thus, a longer coupling distance is required to obtain a large mutual induction. As a result, the size length needs to be enlarged. This requirement hinders the downsizing for IC formation and moreover causes the same critical defect as with the first example in that the self resonance frequency lowers, thereby leading to property deterioration such as an increase in loss for the quasi-microwave band operation.

Also, as a third example of class-B push-pull amplifier used for a power amplification stage in the quasi-microwave band, there is a literature, titled "High-efficiency 1-, 2-, and 4-W Class-B FET Power Amplifiers" (1986, IEEE Transactions on Microwave Theory and Techniques). As shown in FIG. 3, in a class-B push-pull amplifier 50, a single phase input signal is converted into two mutually antiphase input signals by using a 180-degree hybrid 51, each of them is separately amplified and the both outputs are compounded by using a 180-degree hybrid 52.

As a fourth example, there is a literature, titled "High-efficiency Class-B Single and Push-Pull Power Amplifiers" (1992, Technical Research Report in the Institute of Electronics, Information and Communication Engineers, MW-92-44, pp. 7–12, in Japanese). As shown in FIG. 4, in a class-B push-pull amplifier 55, two mutually antiphase input signals are made out from a single phase input signal by using a 180-degree hybrid 56 and separately amplified through matching circuits 57 and 58 as well as FETs 59 and 60, respectively. After one output is delayed in phase in a 180-degree hybrid 61, both outputs are passed through reflective circuits 62 and 63 for third harmonics, respectively, and compounded in a λ/4 dielectric resonator 64. Incidentally, the reflective circuits 62 and 63 for third harmonics are provided in this example, but are not directly related to the push-pull performance. With this example, the mutually antiphase outputs are made in-phase by using the 180-degree hybrid 61 and compounded in the λ/4 dielectric resonator 64. At that time, the second harmonics are canceled at the composition of outputs and not output since they become mutually antiphase at the passage of the 180-degree hybrid 61.

Furthermore, as a fifth example, there is a literature, titled "Design Method of a balun for push-pull amplifiers" (Transistor Technique Feb., 1993, pp. 351–362 in Japanese, CQ Publisher). As shown in FIG. 5, in this class-B push-pull amplifier 65, two mutually antiphase input signals are made out from a single phase input signal through aid of the 180-degree hybrid 66 using a λ/4 coaxial line and separately amplified through matching circuits 67A and 67B as well as amplifier elements 68A and 68B, respectively. Both outputs are passed through the matching circuits 69A and 69B, respectively, and compounded in a 180-degree hybrid 70 similarly using a λ/4 coaxial line.

However, the above class-B push-pull amplifiers 50, 55 and 65 employ distributed constant type elements, such as

3

180 degree hybrids, λ/4 dielectric resonators or λ/4 coaxial lines. Because a distributed constant type element is incapable of inverting the polarity of a signal, a distortion occurring in a class-B operation FET cannot be restored at the composition of outputs. Thus, amplifiers shown in these examples have encountered a problem in being no avail for linear or quasi-linear amplification.

In addition, a distributed constant type element has frequency dependence. For example, when designing an amplifier IC for 2 GHz on a GaAs semiconductor having an effective dielectric constant of 13, a value of λ/4 becomes approx. 1.0 cm. Since the size of an IC is several millimeter square, this length made the IC larger in size and therefore presented a problem of being extremely difficult in implementation.

SUMMARY OF THE INVENTION

In view of the foregoing, an object of this invention is to provide a transformer and amplifier exhibiting a small lowering in self resonance frequency and having a large mutual inductance.

The foregoing object and other objects of the invention have been achieved by the provision of a transformer, comprising: first flat coils formed by pattern wiring of conductors on a semiconductor substrate surface; an insulating layer stacked in such a manner to cover first flat coils; and second flat coils by the pattern wiring of conductors along the pattern form of first flat coils on the insulating layer surface.

Also, the foregoing object and other objects of the invention have been achieved by the provision of an amplifier, comprising: a first output 5-terminal transformer, incorporating first flat coils formed by pattern wiring of conductors on a semiconductor substrate surface, an insulating layer stacked in such a manner to cover first flat coils; and second flat coils by the pattern wiring of conductors along the pattern form of first flat coils on the surface of the insulating layer, wherein one of the first and second flat coils is formed with both of the first and second spirally coiled patterns, primary coils are formed with the middle connection point in the first and second patterns mutually connected at one end for each let to be a common intermediate electrode, the other end of the first pattern let to be a first electrode, and the other end of the second pattern let to be a second electrode, and a secondary flat coil is formed in contrast with the relevant primary coil formed of either the first or second flat coil which wound spirally and stacked in a plane vertically; a first field effect transistor with the drain terminal connected to the first electrode of the primary coil in the first transformer, the source terminal connected to the ground and the gate terminal used as a first input terminal, and a second field effect transistor with the drain terminal connected to the second electrode of the primary coil in the first transformer, the source terminal connected to the ground, and the gate terminal used as a second input terminal; has one terminal of the secondary coils is connected to the ground, the supply of power is received from said intermediate electrode of the primary coil in the first transformer, and an amplified signal is outputted from the other terminal of the secondary coil.

The first flat coils are formed on a semiconductor substrate surface with the pattern wiring of a conductor, and the second flat coils are formed along the pattern wiring of the first flat coils on an insulator layer surface spaced by an insulating layer having a predetermined thickness with the pattern wiring of any conductor, so that a large mutual inductance can be obtained.

4

In addition, according to the present invention, a power amplification based on the class-B push-pull operation can be carried out by forming an amplifier with the aid of a first output 5-terminal transformer in which one of the first and second flat coils forms a primary coil comprising both of the first and second spirally coiled patterns with the middle connection point in the first and second patterns mutually connected in series at one end for each let to be a common intermediate electrode, the other end of the first pattern let to be a first electrode, and the other end of the second pattern let to be a second electrode, and either the first or the second coil, wound in a spiral form corresponding to the relevant primary coil, is formed as a secondary flat coil.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 6A and 6B are circuit diagrams showing the configuration of a transformer according to a first embodiment of the present invention;

FIG. 7 is a Smith chart showing a change in the impedance of a primary coil, corresponding to a change in the impedance of a secondary coil;

DETAILED DESCRIPTION OF THE EMBODIMENT

Preferred embodiments of this invention will be described with reference to the accompanying drawings:

(1) First Embodiment

Figure 10:
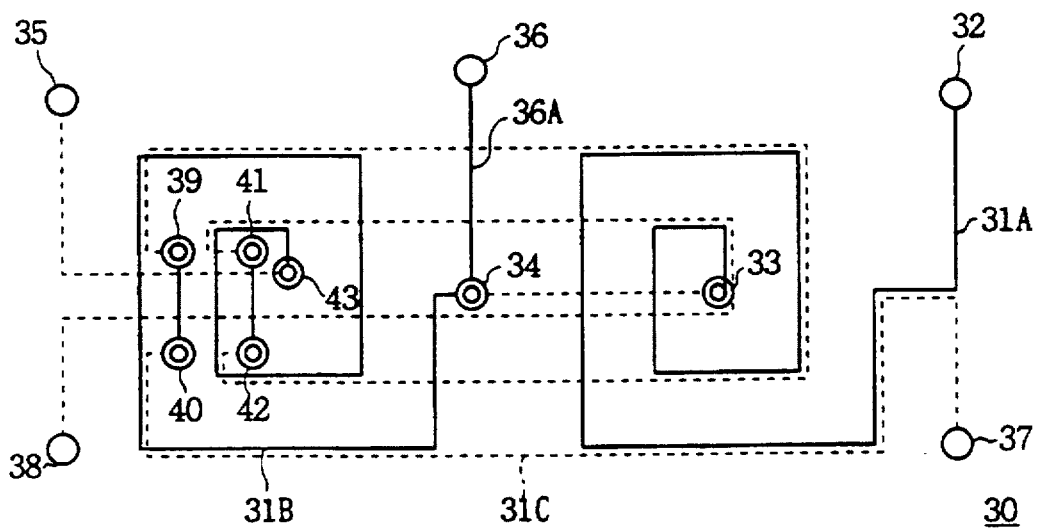
FIG. 10 is a schematic diagram showing a 5-terminal transformer according to a second embodiment of the present invention.

In FIGS. 6A and 6B, 10 denotes a transformer based on square spiral coils formed on a semiconductor substrate surface. FIG. 6A is a top view of the transformer viewed from above the substrate, while FIG. 6B is a sectional view. The transformer 10 comprises a secondary coil 12A mostly formed on the surface of a semiconductor substrate 11 made of a gallium arsenic compound, a SiN (silicon nitride) film deposited as an insulating layer 13 in such a manner as to cover the secondary coil 12A on the semiconductor substrate surface 11A, and a primary coil 12B mostly formed on the surface of the insulating layer 13.

Most parts of the secondary coil 12A is formed by depositing evaporated alloy of titanium, platinum and gold on the semiconductor substrate surface 11A in accordance with a conductor pattern of a coil coiled in a square spiral. Then, the insulating layer 13 is formed, the layer comprising a silicon nitride layer, 0.2 μm thick, on the semiconductor substrate surface 11A, on which this secondary coil 12A is formed, by the chemical vapor deposition (CVD) process. Furthermore, most parts of the conductor pattern of a primary coil 12B is formed to be approx. 4 μm thick on this insulating layer surface 13A by the gold plating process.

Except the terminals and a portion near the terminals, the secondary coil 12A and the primary coil 12B have the respective coil patterns almost vertically opposed to each other with an insulating layer 13 interposed between them and overlapped nearly in the same planar position.

The secondary coil 12A on the semiconductor substrate surface 11A begins to wind a coil with the terminal 14 as a starting point, is then connected via a through hole 16 to a conductor formed on the insulating layer surface 13A at 10C, connected again via a through hole 17 to a conductor wired on the semiconductor substrate surface 11A, from the center of spiral winding pitch and thereafter connected to the terminal 15.

On the other hand, the primary coil 12B on the insulating layer surface 13A begins to wind a coil with the terminal 18 as a starting point, is then connected via a through hole 20 to a conductor formed on the semiconductor substrate surface 11A at 10D, and is connected via a through hole 21 to a conductor on the insulator substrate surface 13A and finally connected to the terminal 19. The length of the respective conductor patterns (hereinafter referred to as conductor length) in these primary coil 12B and secondary coil 12A are, for example, set to the order of a tenth to a hundredth exclusive of the wavelength of a high frequency signal of several GHz to be inputted.

Here, letting the electrical length S to be expressed by using a conductor length L in terms of the following equation:

$$S = \frac{L}{\lambda} \quad (1)$$

when the voltage of a wavelength λ is applied between the terminals of a coil, the difference in electrical length between the adjacent patterns relative to the input terminal becomes one turn for the respective patterns of the primary coil 12B and the secondary coil 12A, and consequently a good transformer can be obtained in which a fall in self resonance frequency is suppressed.

In the above arrangement, letting the self inductance of the primary coil 12B and the secondary coil 12A to be L1 and L2, respectively, and the mutual inductance to be M when a load impedance is connected between the terminals 14 and 15 of the secondary coil of a transformer 10, the input impedance Zin is expressed in terms of the following equation:

$$Zin = j\omega L_1 + \frac{\omega^2 M^2}{j\omega L_2 + Z_L} \quad (2)$$

Figure 1A:
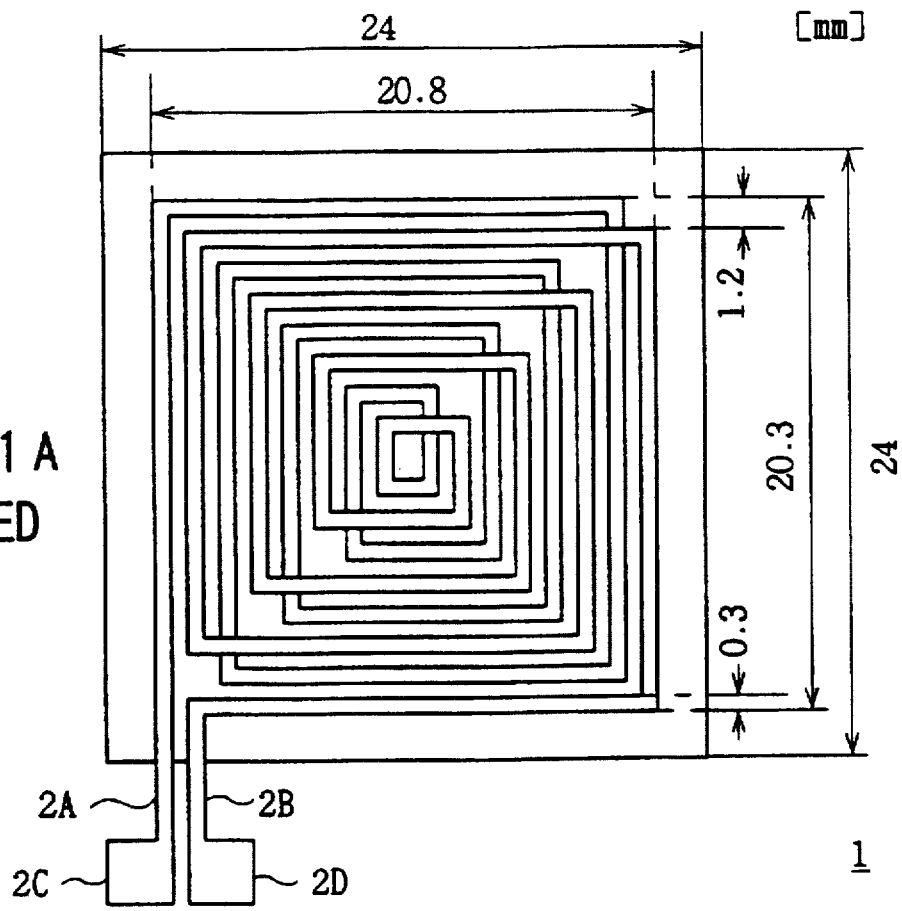
FIGS. 1A and 1B are schematic diagrams showing the top surface (FIG. 1A) and the section (FIG. 1B) of a conventional transformer.
Figure 1B:
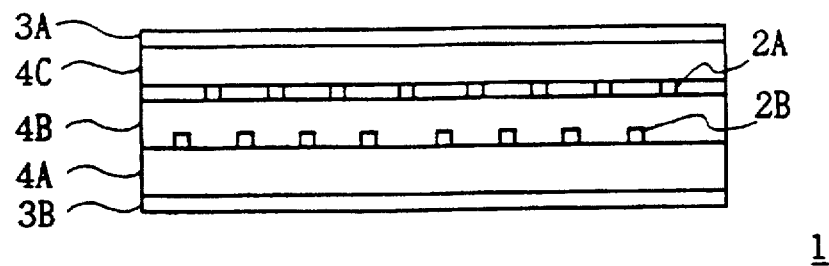
Figure 2A:
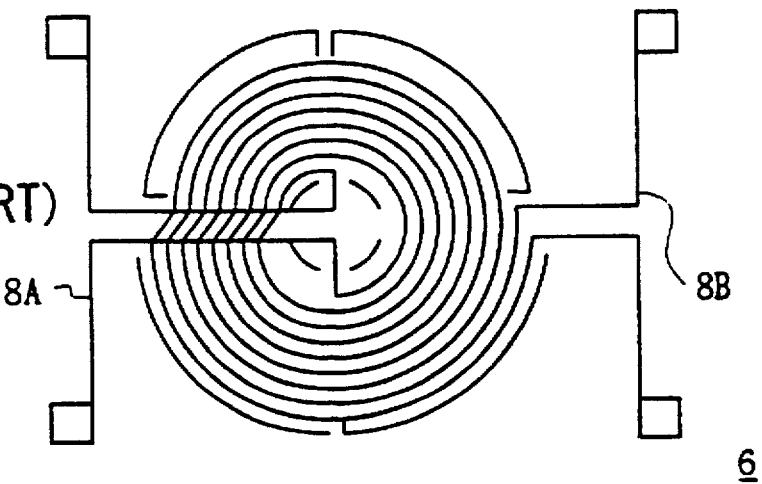
FIGS. 2A and 2B are schematic diagrams showing the top surface (FIG. 2A) and the section (FIG. 2B) of another conventional transformer.
Figure 2B:
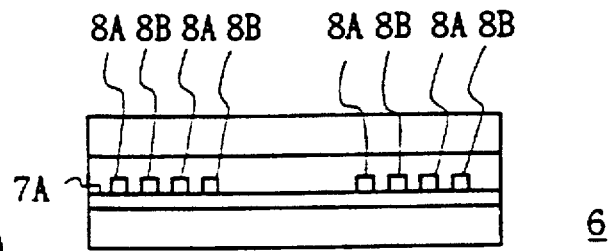
Figure 3:
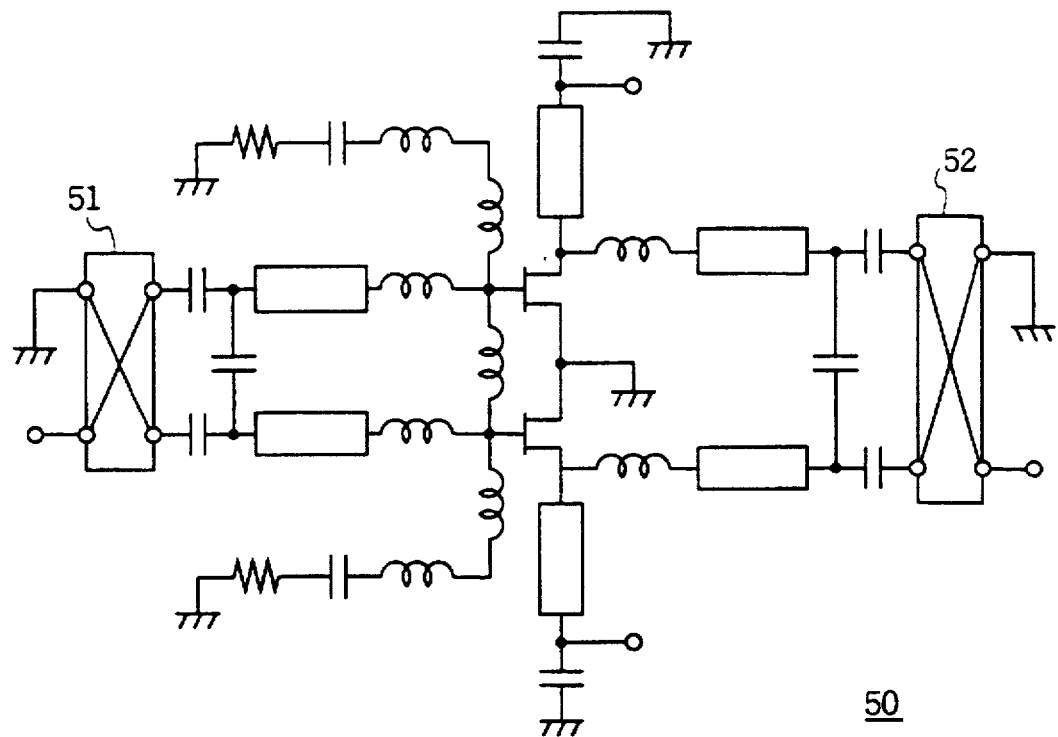
FIGS. 3 to 5 are circuit diagrams showing a conventional amplifier of class-B push-pull operation.
Figure 4:
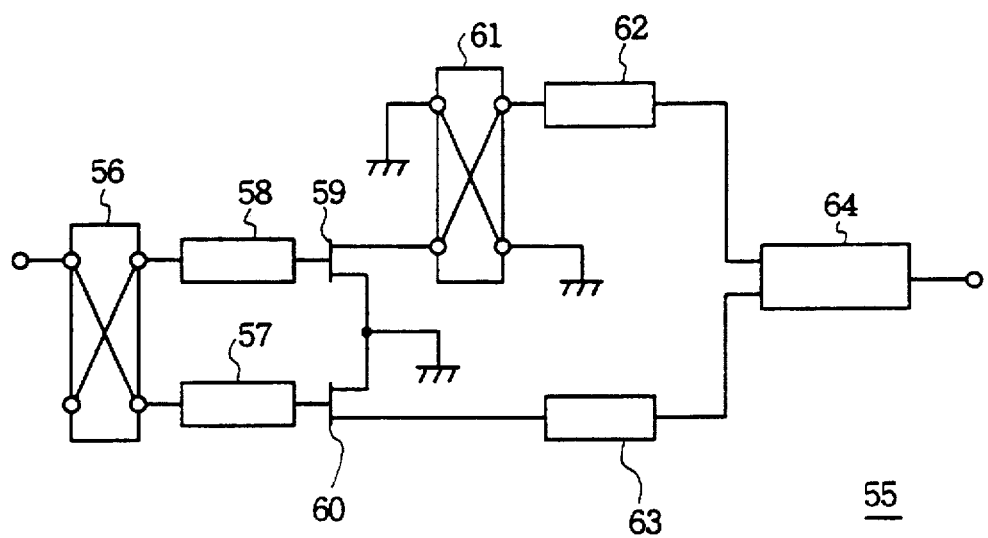
Figure 5:
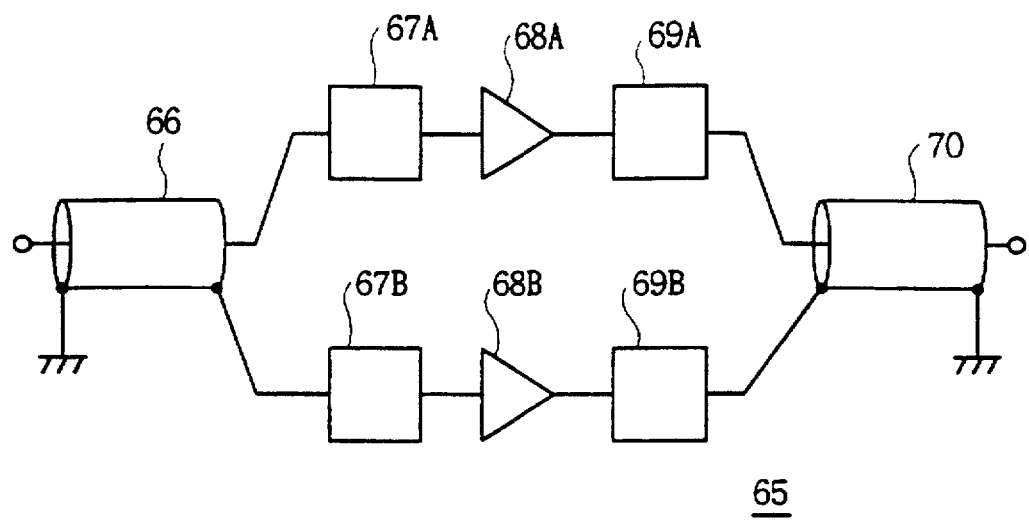
Figure 8:
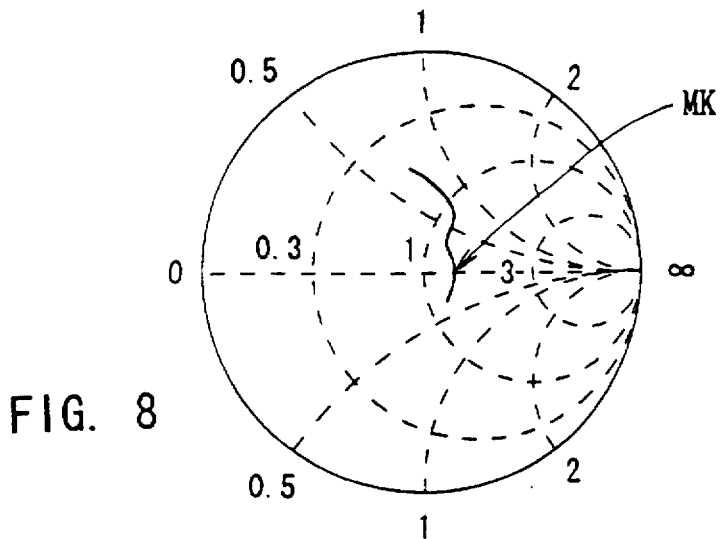
FIG. 8 is a Smith chart showing the S parameter of the transformer according to the first embodiment.

Here, letting ZL to be the load impedance, the input impedance Zin is indicated with the hatched part a of the Smith chart of FIG. 7 as a transformation to a 2-dimensional plane by using an expression comprising the real part (R) and the imaginary part (Im), R+jIm. FIG. 8 shows an S parameter ranging from 1 to 10 GHz in a 4-terminal semiconductor transformer 10. As indicated by MK of this FIG. 8, the self resonance frequency of the transformer 10 is approx. 8.5 GHz and is found to be as high a frequency as sufficiently usable in the quasi-microwave band.

Figure 9:
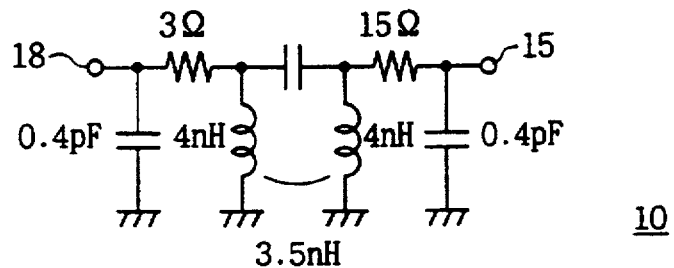
FIG. 9 is a circuit diagram showing the equivalent circuit of the transformer according to the first embodiment.

In addition, the equivalent circuit of this 4-terminal transformer 10 becomes as shown in FIG. 9, where the self inductance of the transformer 10 is approx. 4 nH and the mutual inductance is approx. 3.5 nH. Because a value of mutual inductance is near to a value of self inductance in this manner, this is found to be a highly good 4-terminal semiconductor transformer having a scarce leakage flux.

According to the above arrangement, a secondary coil formed on the semiconductor substrate surface 11A and a primary coil formed on the insulating layer surface 13A with the 0.2 μm thick insulating layer 13 made of silicon nitride interposed are disposed as to overlap at the planar same position and form a square spiral transformer 10, thereby enabling a highly good 4-terminal semiconductor transformer, hardly different between self and mutual inductance and scarce in leakage flux, to be obtained.

Furthermore, according to the above arrangement, the primary and the secondary coils are spaced apart only 0.2 μm by the SiN layer 13 and extremely close to each other, so that a large mutual inductance can be obtained.

Also, according to the above arrangement, the primary coil and the secondary coil are vertically disposed at the same position by using through holes and original patterns are used for the primary and secondary coils constituent of a transformer and accordingly a fall in self resonance frequency decreases, so that no deterioration in characteristics, such as an increase in lose, occurs. Thus, even when the conductor length is shortened corresponding to the quasi-microwave band of several gigahertz, this arrangement can provide sufficient characteristics for a transformer.

Also, according to the above arrangement, because the primary and secondary coils are vertically overlapped by a lap winding, the circuit occupying area in an IC is equal to that of a single coil and this winding is suitable for the downsizing of an IC. Furthermore, since no ferroelectric is used in the intermediate layer between the primary and secondary coils but silicon nitride is deposited, this transformer 10 can be easily constructed by using an ordinary semiconductor manufacturing process.

(2) Second Embodiment

FIG. 10 shows a 5-terminal transformer 30 according to a second embodiment. The transformer 30 comprises a first and second primary coils 31A and 31B composed of square spiral coils formed on the upper insulating layer surface 13A. In the first primary coil 31A, a square coil begins with the terminal 32 as a starting point, and is led out through a through hole 33 to the terminal 34 by using a conductor pattern on the lower semiconductor substrate surface 11A and connected to the second primary coil 31B at the terminal 34. In this manner, the terminal 34 is shared by the first and second primary coils.

In the second primary coil 31B, the terminal 35 is provided on the other terminal. The terminal 34 forms a through hole, from where a lead 36A is wired on the upper insulating layer surface 13A by using the wiring of the upper insulating layer surface 13A and the middle tap 36 is led put. On the lower semiconductor layer surface 11A, a secondary coil 31C, overlapped at the same planar position as with the primary coils 31A and 31B and having the terminals 37 and 38 on the both ends, is wired mostly.

The crossing portions of different patterns for leading out the terminal 38 of the secondary coil 31C formed on the lower semiconductor substrate surface 11A are wired by using through holes 39, 40, 41 and 42 to avoid their mutual contact. Similarly, the terminal 35 of the primary coils 31A and 31B is wired from the insulating layer surface 13A to the semiconductor substrate surface 11A to avoid the contact of patterns.

Figure 11:
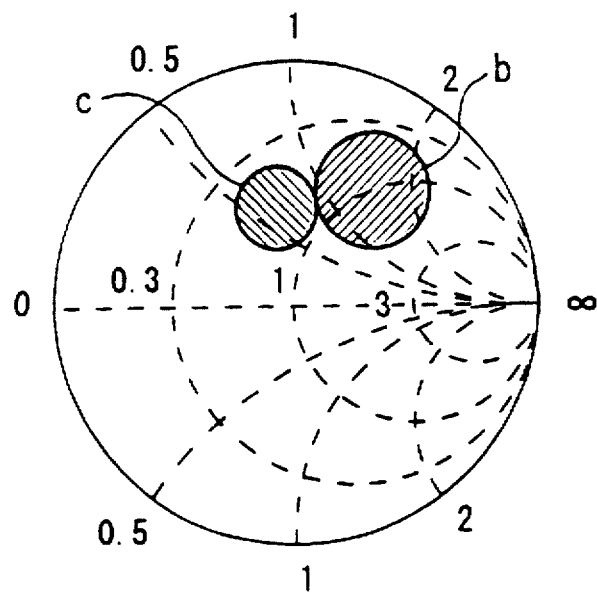
FIG. 11 is a Smith chart showing a change in the impedance of a primary coil, corresponding to a change in the impedance of a secondary coil in the 5-terminal transformer according to the second embodiment of the present invention.

FIG. 11 shows an change in impedance viewed from the first and second terminals 32 and 35 (indicated with "b" and "c" in FIG. 11) when varying the impedance on the secondary side of the 5-terminal transformer 30 formed in this manner. This result reveals the presence of mutual inductance because the primary side impedance changes to some extent corresponding to the varied range of the secondary impedance.

Figure 12:
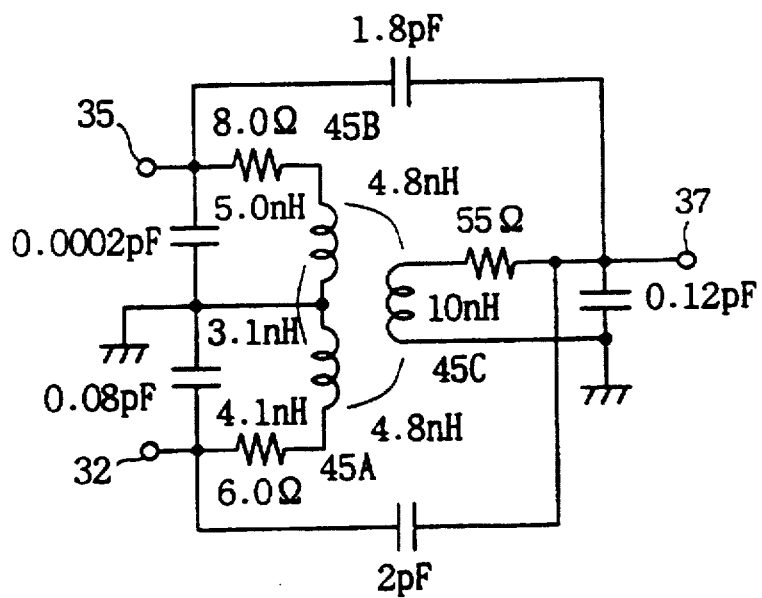
FIG. 12 is a circuit diagram showing the equivalent circuit of the 5-terminal transformer according to the second embodiment.

FIG. 12 shows the equivalent circuit of this 5-terminal transformer 30 at 1.9 GHz. From this, it is found that the self inductance of this semiconductor transformer 30 is approx. 5 nH and the mutual inductance is approx. 4.8 nH, that is, a value of mutual inductance is near to a value of self inductance and therefore a highly good 5-terminal semiconductor transformer having a scarce leakage flux is obtained.

(3) Third Embodiment

Figure 13:
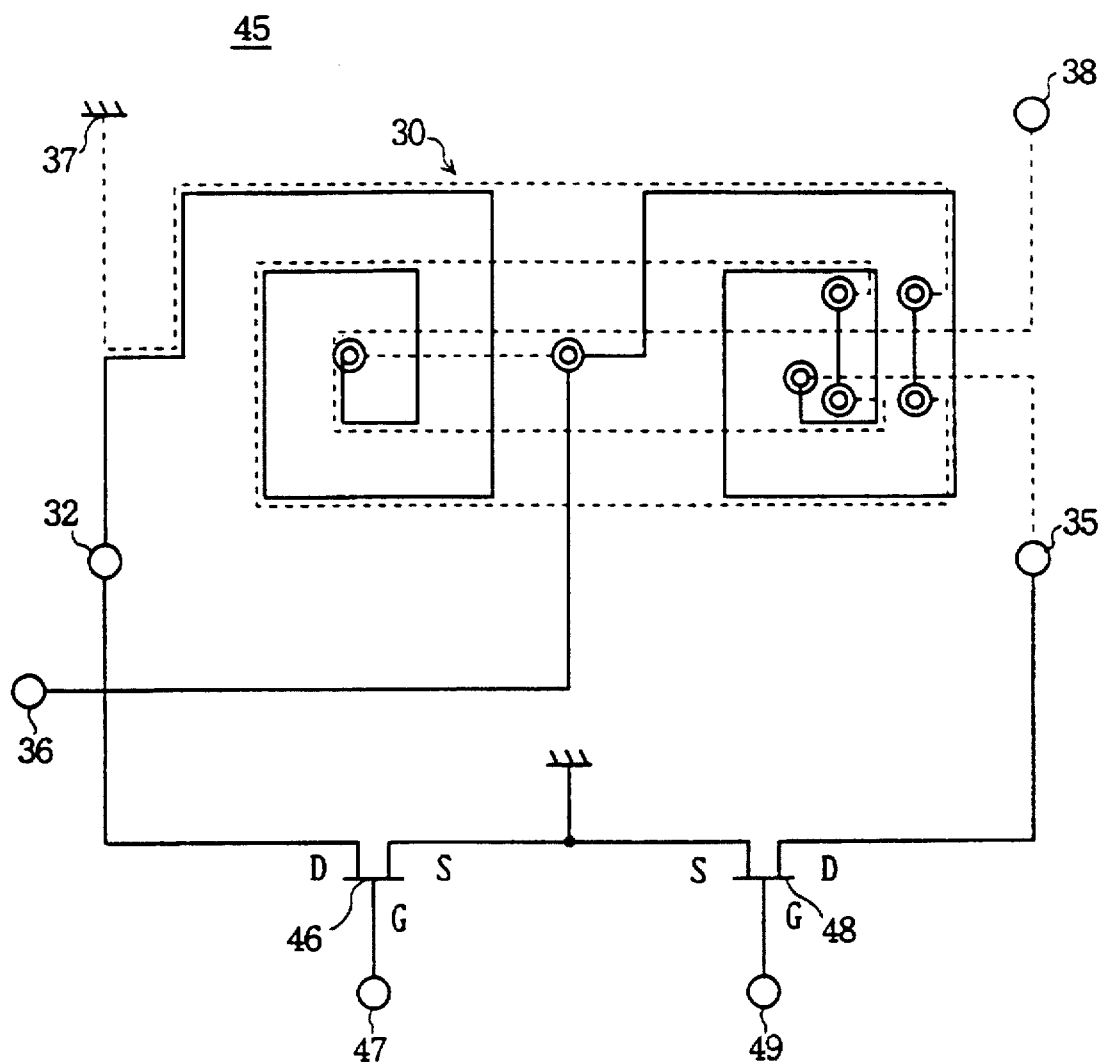
FIG. 13 is a schematic diagram showing a class-B push-pull amplifier according to a third embodiment.

In FIG. 13 where like symbols are attached to points corresponding to those of FIG. 10, numeral 45 denotes a power amplifier of class-B push-pull performance formed on a semiconductor substrate using a 5-terminal transformer 30. In the power amplifier 45, the drain terminal D of the FET 46 is connected to the terminal 32 of the primary coil 31A in the 5-terminal transformer 30 shown in FIG. 10. In the FET 46, the source terminal S is connected to the ground and the gate terminal G is made a first input terminal 47. Similarly, to the terminal 35 of the primary coil 31B is connected the drain terminal D of the FET 48. In the FET 48, the source terminal S is connected to the ground and the gate terminal G is made a second input terminal 49.

On the other hand, the midway tap 36 is made a power supply terminal, one terminal 37 of the secondary coil 31 is connected to the ground and the other terminal 38 is made an output terminal.

According to the above arrangement, in the power amplifier 45, the mutual induction of the primary coils 31A and 31B with the secondary coil 31C occurs under an action of a high-frequency magnetic field generated in the primary coils 31A and 31B by a high-frequency AC signal input from the input terminals 47 and 49. As a result, mutually antiphase signals are synthesized with the polarity inverted. This action differs from that of a synthesis by distributed constant elements and allows distorted waves generated by the class-B performance FETs 46 and 48 to be mutually compensated. Thus, the distortion component is greatly reduced and a linear performance is implemented.

Here will be shown the result of an experiment to confirm that a power amplifier 45 according to the present invention actually makes a class-B push-pull performance.

Figure 14A:
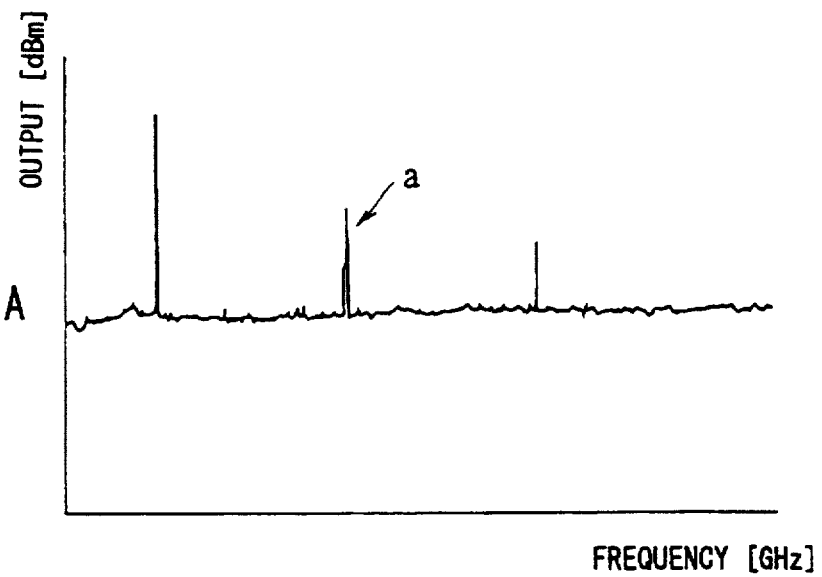
FIGS. 14A and 14B are an output graph (FIG. 14A) and an output waveform graph (FIG. 14B) to be submitted to the illustration of the class-B operation of FIG. 13.
Figure 14B:
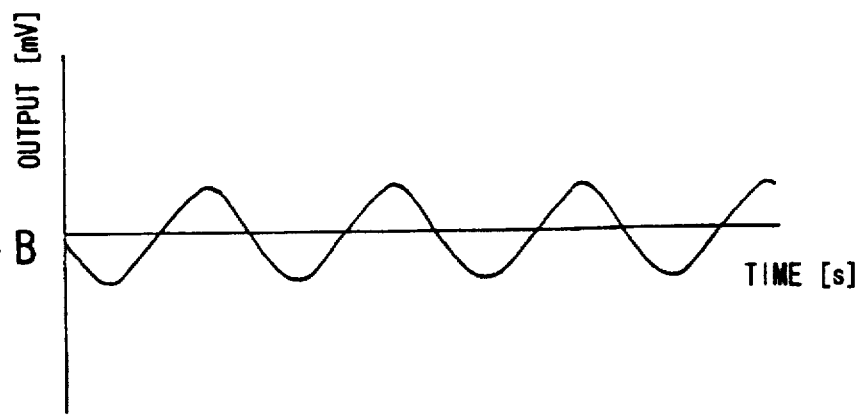
Figure 15A:
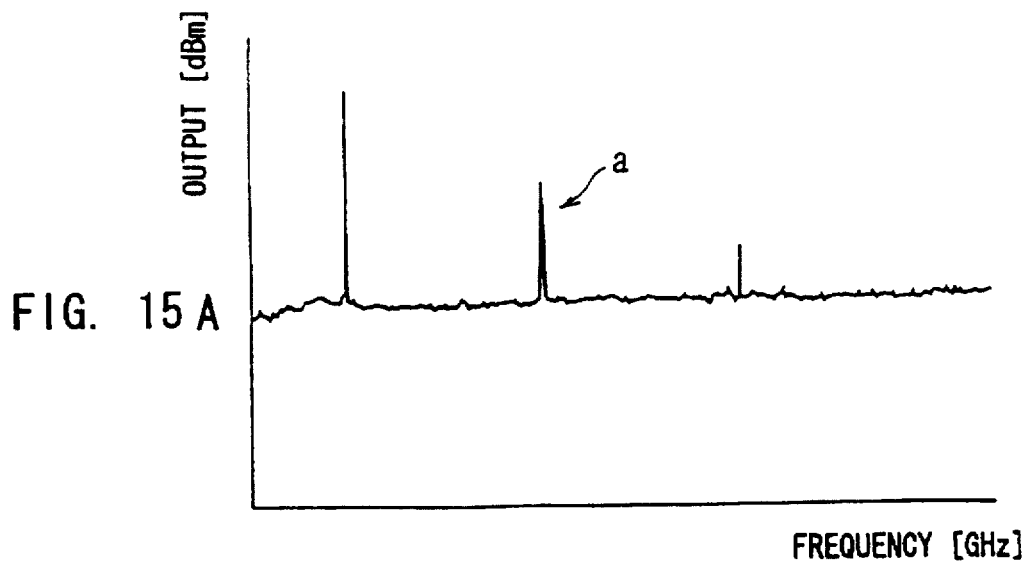
FIGS. 15A and 15B are an output graph (FIG. 15A) and an output waveform graph (FIG. 15B) to be submitted to the illustration of the class-B operation of FIG. 13.
Figure 15B:
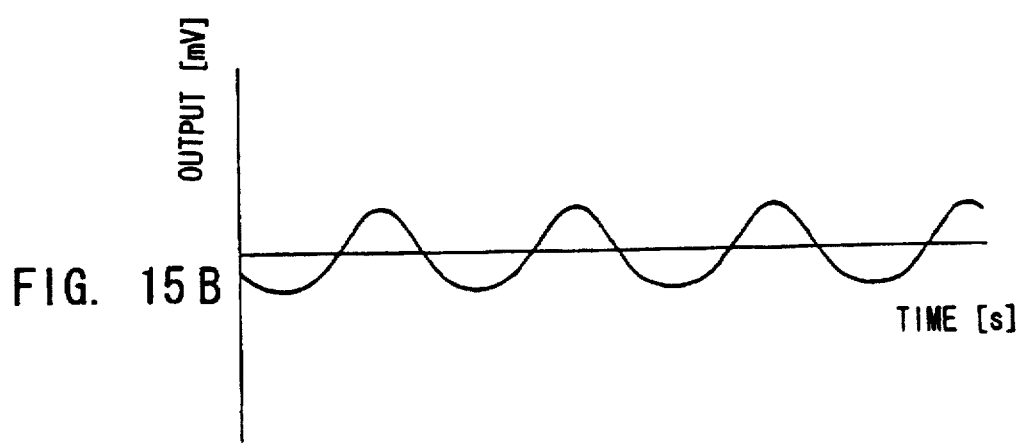

FIGS. 14A, 14B, 15A, 15B, 16A, and 16B show examples of measured output signal spectra and time-developing waveforms of output signals at the output terminal 38 of the power amplifier 45 is FIG. 13. Here, FIGS. 14A and 14B show the behavior of measured output signal spectra and time-developing waveforms of output signals for a power amplifier 45 operating only with FET 48 after removal of FET 46, whereas FIGS. 15A and 15B show the behavior of measured output signal spectra and time-developing waveforms of output signals for a power amplifier 45 operating only with FET 46 after removal of FET 48. In this manner, when a power amplifier 45 is operated with one FET, either FET 46 or FET 48, it can be confirmed in either case that a second harmonic is generated in the output signal spectrum and a distortion appears in the time-developing waveform (indicated with an arrow "a" in FIGS. 14A and 15A).

Figure 16:
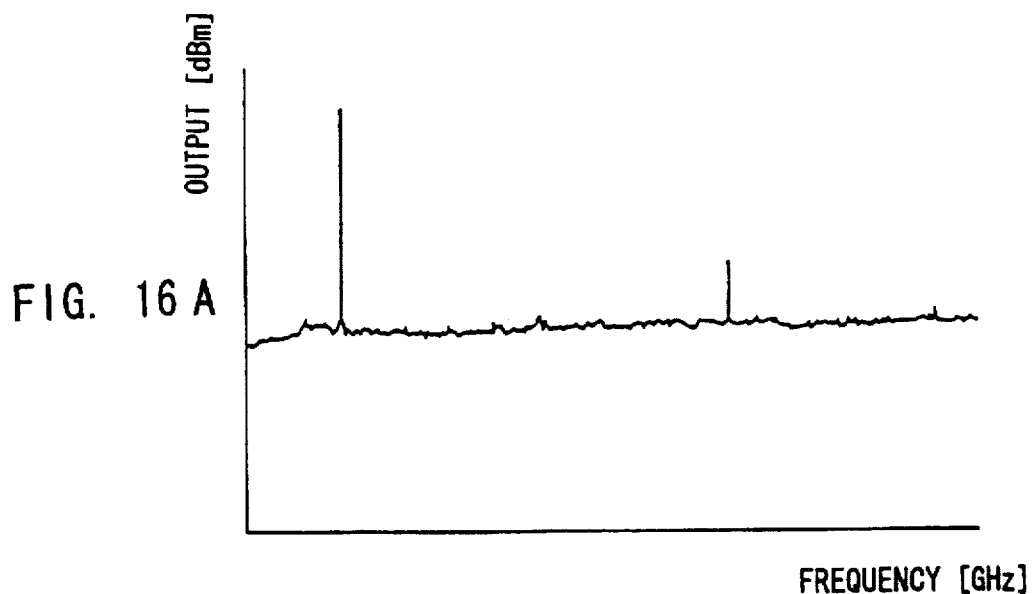
FIGS. 16A and 16B are an output graph (FIG. 16A) and an output waveform graph (FIG. 16B) to be submitted to the illustration of the class-B operation of FIG. 13.
Figure 16:
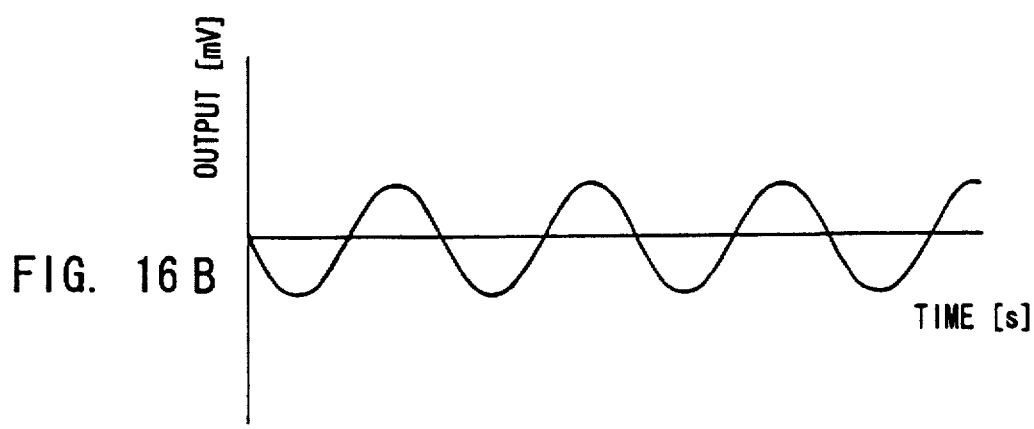

On the contrary, when a power amplifier 45 is operated with both FET 46 or FET 48, it can be confirmed from the result on output signal spectrum that a second harmonic is suppressed as shown in FIG. 16A and further from the result on time-developing wave that any distortion is eliminated as shown in FIG. 16B).

From these experimental results it can be confirmed that the power amplifier 45 according to the present invention operates as a linear amplifier.

According to the above embodiment, antiphase and inverse polarity signals due to the mutual induction between the primary and the secondary coils is made to occur on each other coil by using two flat coils formed on the semiconductor substrate without need for a distributed constant element and can be compounded. By this action, distorted waves on the FETs are compensated with each other and a linear performance can be implemented as a result of an extreme suppression of the distortion component. In this way, a highly efficient class-B push-pull amplifier operable by a high-frequency signal in the quasi-microwave band can be easily formed on a semiconductor substrate. Consequently, the workable time without charging can be greatly extended in using a portable telephone or the like. This greatly induces a portable telephone to be widely used and this effect is enormous.

(4) Fourth Embodiment

Figure 17:
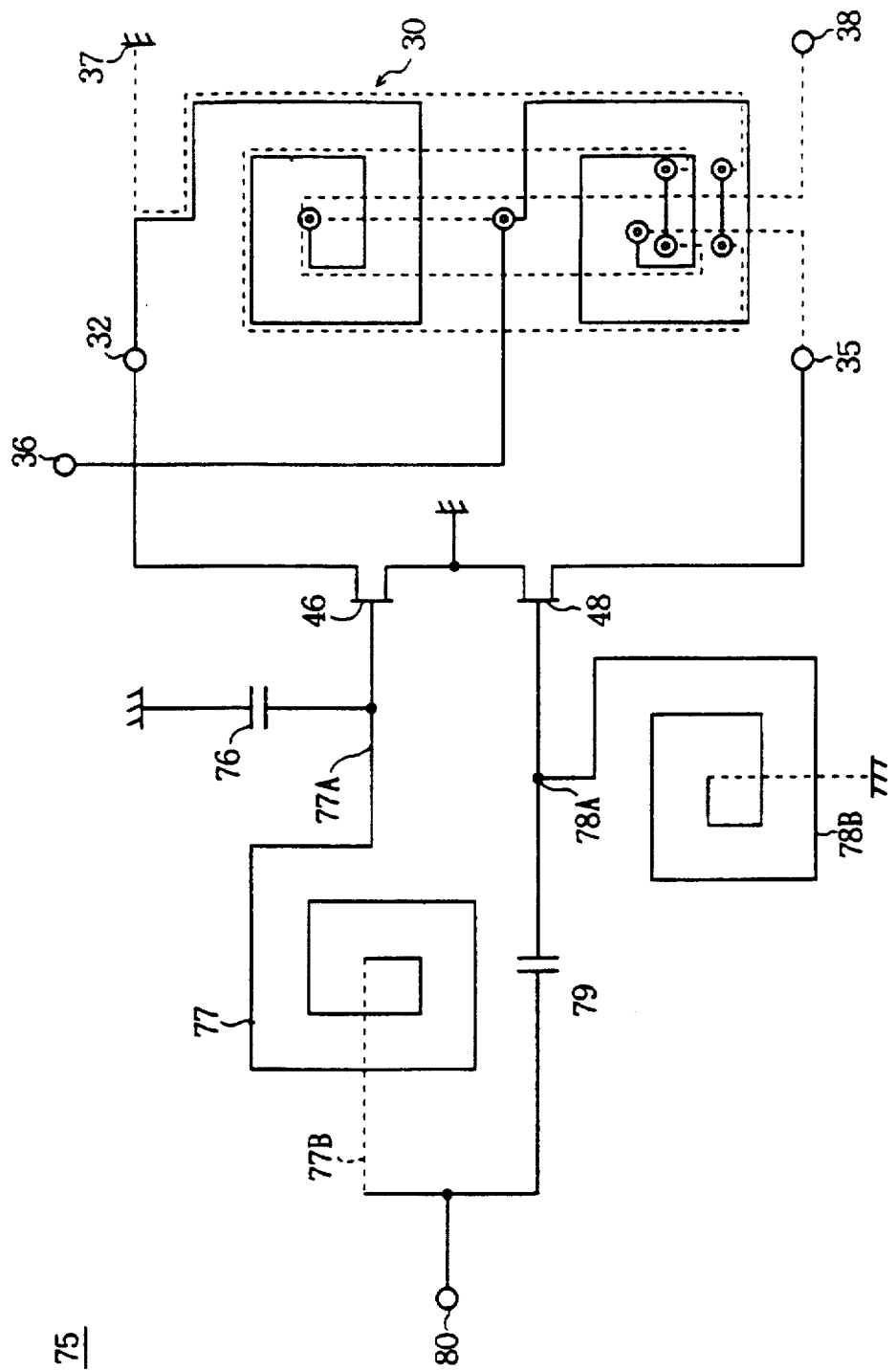
FIG. 17 is a schematic diagram showing a class-B push-pull amplifier according to a fourth embodiment.

In FIG. 17 where like symbols are attached to points corresponding to those of FIG. 13, numeral 75 denotes a power amplifier of class-B push-pull performance formed on a semiconductor substrate according to the fourth embodiment.

In the power amplifier 75, the gate terminal G of the FET 46 in the power amplifier 45 is connected to one terminal 77A of the capacitor 76 having the other terminal connected to the ground (GND) and the square spiral coil 77 in parallel. On the other hand, the gate terminal G of the FET 48 is connected to one terminal 78A of the square spiral coil 78 and the capacitor 79 in parallel, while the other terminal of the coil 78 is connected to the GND. The terminals 77B of the coil 77 and 78A of the coil 78 are connected via a capacitor 79 to each other and an input terminal 80 is provided at the connecting point between the terminal 77B and the capacitor 79.

In the above arrangement, a single-phase input signal which is input from the input terminal 80 are divided into two. One signal is led to have a phase lag of 90° relative to the input signal by the capacitor 76 and the coil 77, whereas the other signal is led to have a phase advance of 90° relative to the input signal by the capacitor 79 and the coil 77. As a result, the signals to be input to the gate terminals G of the FETs 46 and 48 are led to have a phase difference of 180° from each other and the 180° power distribution on the input side can be implemented, thereby enabling a high-efficiency class-B push-pull amplifier to be put to practical use.

(5) Fifth Embodiment

Figure 18:
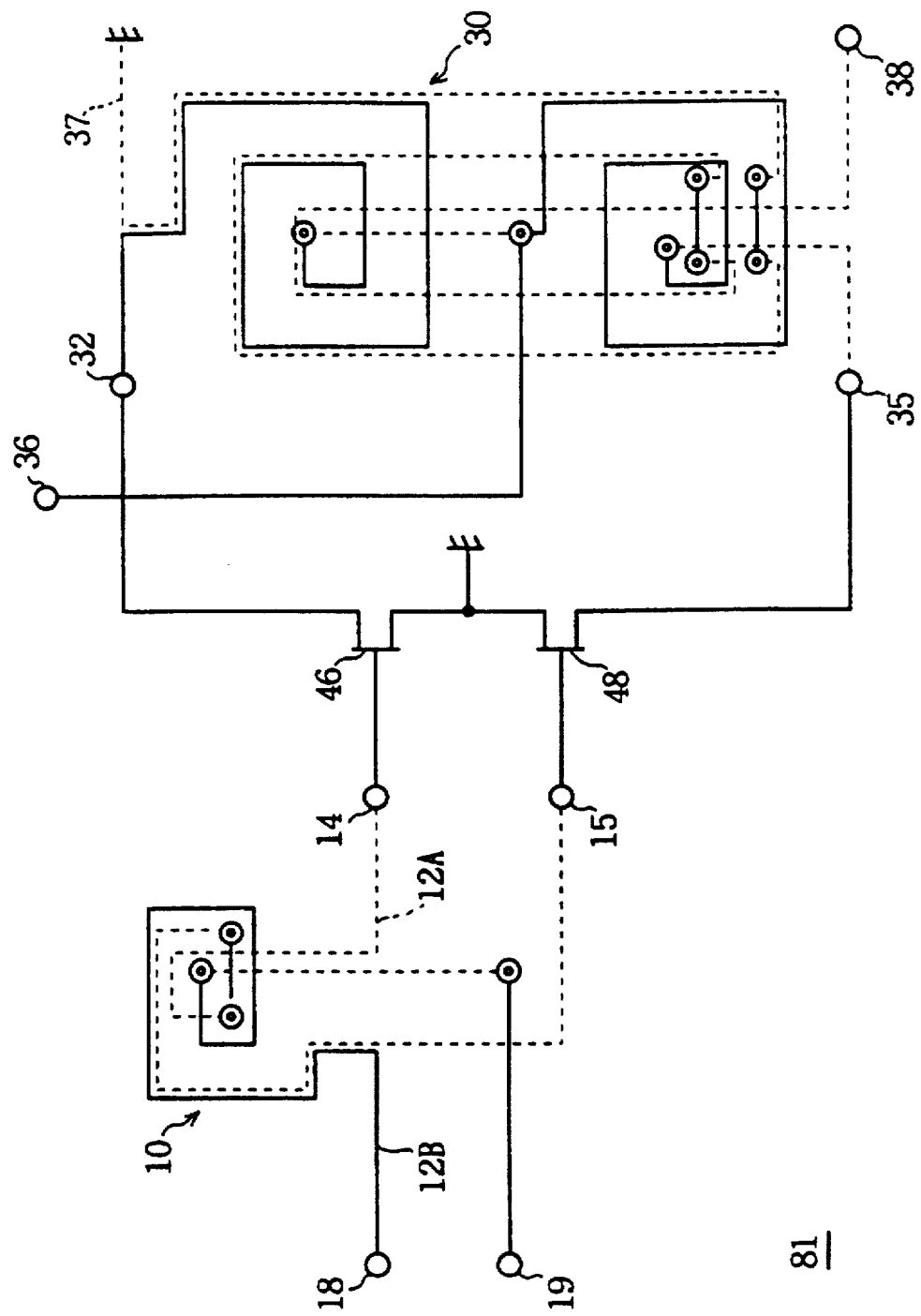
FIG. 18 is a schematic diagram showing a class-B push-pull amplifier according to a fifth embodiment.

In FIG. 18 where like symbols are attached to points corresponding to those of FIG. 13, numeral 81 denotes a power amplifier of class-B push-pull performance formed by using a transformer 10 on a semiconductor substrate according to Embodiment 5.

In the power amplifier 81, two terminals 14 and 15 of the secondary coil 12A of the transformer 10 are connected to the respective gate terminals G of the FETs 46 and 48, while one terminal 18 of the primary coil 12B is let to be a power supply terminal and the other terminal 19 is let to be an input terminal, to which a single-phase signal is input.

In the above arrangement, a single-phase input signal which is input from the input terminal 19 are divided into two at the transformer 10 and the signals appearing at the two terminals 14 and 15 on the secondary side are led to have a phase difference of 180° from each other. Thus, an effect similar to that of the fourth embodiment is obtained.

(6) Other embodiments

Figure 19:
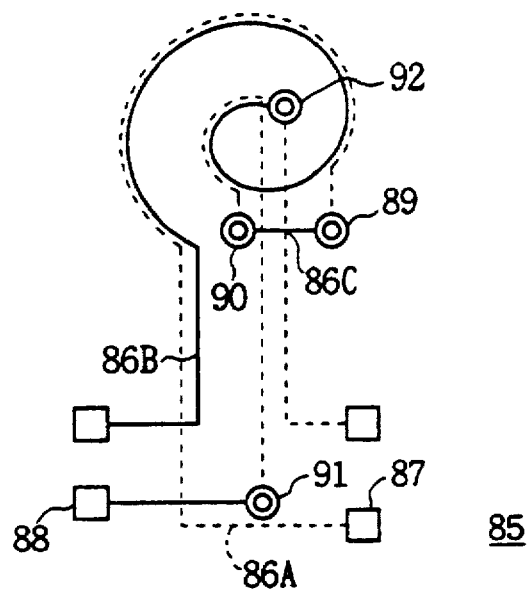
FIG. 19 is a schematic diagram showing a circular spiral coil.

Incidentally, the above embodiments have dealt with the case of using a coil of square spiral form as the constituent coil. However, the present invention is not limited to this case, and a coil of circular spiral form can be used as shown in the transformer 85 of FIG. 19. In the transformer 85 using a secondary coil 86A and a primary coil 86B of circular spiral form, the secondary coil 86A begins to be wound at the terminal 87 and one terminal 88 is led out from the center.

In the center of the secondary coil 86A, to lead out the terminal 88, after a mutual contact in the crossing portion 86C of two patterns is once avoided by wiring the coil via a through hole 89 onto the insulating layer surface 13A, the secondary coil 86A is again connected via a through hole 90 to a conductor pattern on the semiconductor substrate surface 11A, further wired via a through hole 91 onto the insulating layer surface 13A and connected to the terminal 88. In this way, the secondary coil 86C is finally formed.

Similarly, a mutual contact of patterns in leading out the terminal of the primary coil 86B is avoided by using a through hole 92. Also in the transformer 85 using circular spiral coils in place of square spiral coils, an effect similar to that of the above transformer 10 is obtained.

Figure 20:
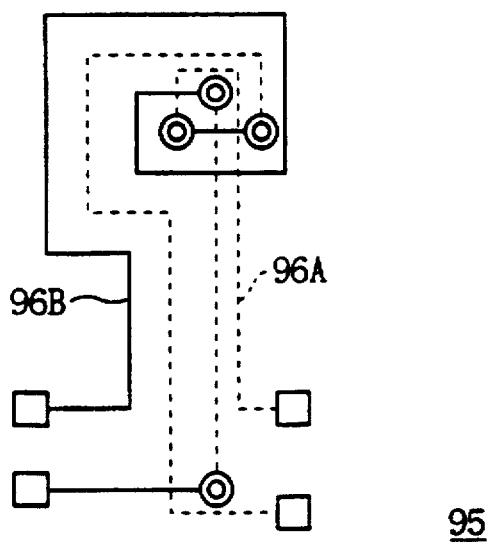
FIG. 20 is a schematic diagram showing a modified example of the planar disposition of a primary coil and a secondary coil.

Furthermore, the above embodiments have dealt with the case of, when overlapping a primary coil and a secondary coil, setting them at the planar same position. However, the present invention is not limited to this case, but as the transformer 95 in FIG. 20, the secondary coil 96A formed on the lower semiconductor substrate surface 11A can be disposed at a planar position deviated from, rather than identical to, the position of the primary coil 96B formed on the upper insulating layer surface 13A.

Figure 21:
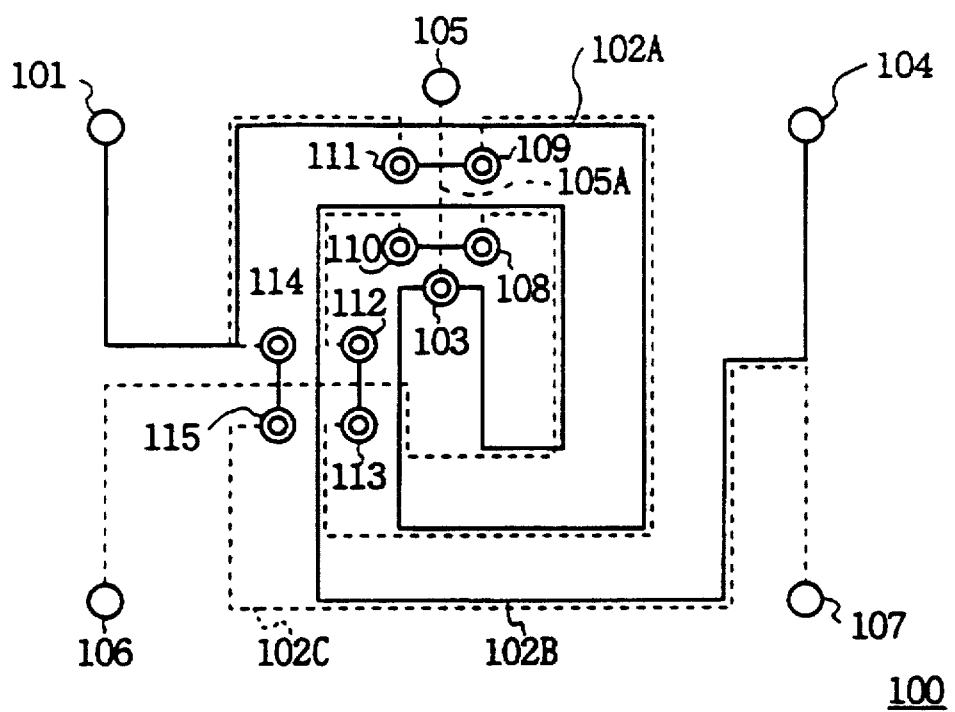
FIG. 21 is a schematic diagram showing a 5-terminal transformer according to still another embodiment of the present invention.

Furthermore, the above embodiments have dealt with the case of forming a 5-terminal transformer by a series connection of primary two coils. However, the present invention is not limited to this case, and the arrangement of transformer 100 as shown in FIG. 21 is allowable. That is, the first flat coil 102A on the primary side is formed on the upper insulating layer surface 13A by a conductor pattern beginning with the terminal 101 and wound in a spiral form. Then, letting the terminal 103 to be a connecting point, this flat coil 102A is wound back from inside the spiral along the space between the conductor patterns of the flat coil 102A to form the conductor pattern of the second flat coil 102B on the primary side and another terminal 104 is provided at the end. Here, the terminal 103 forms a through hole, which is used to lead out the middle tap 105 onto the lower semiconductor substrate surface 11A.

The secondary coil 102C is formed on the lower semiconductor substrate surface 11A by a conductor pattern wired in such a manner as to overlap on the primary coils 102A and 102B of the upper layer at the same position. In the secondary coil 102C, two terminals 106 and 108 are provided at both ends, a conductor of winding is wired via through holes 108 and 109 onto the insulating layer surface 13A in such a manner as not to make contact with the crossing lead 105A for the middle tap 105 of the primary coil 102, and wired again via through holes 110 and 111 onto the semiconductor substrate surface 11A.

Similarly, because the secondary coil 102C passes across its own wound portion of spiral pattern to lead out the terminal 106, the grade crossing on the opposite layers sandwiching the insulating layer is provided by using through holes 112, 113, 114 and 115, thereby preventing the mutual contact of wiring conductors.

Further, the above embodiment have dealt with the case where the primary flat coil of a 5-terminal transformer 100 comprises a first flat coil 102A wound in a spiral pattern and a second flat coil 102B formed by winding back a conductor pattern from the end 103 of the flat coil 102A taken as a connection point inward along the space between the conductor patterns of the flat coil 102A. However, the present invention is not limited to this case, and the primary flat coil can comprise a first coil as mentioned above and a second coil formed by further winding a conductor pattern connecting to the inside end of the first flat coil toward the center inside the first flat coil.

Further, the above embodiment have dealt with the case where the primary flat coil of a 5-terminal transformer 30 comprises a series connection of two coils identical in structure. However, the present invention is not limited to this case, and the primary coil can comprise a series connection of two coils different in structure.

Further, the above embodiment have dealt with the case where the conductor forming a secondary coil is made of an alloy of titanium, platinum and gold and a conductor forming the primary coil is made of gold. However, the present invention is not limited to this case, and the material of a coil need only to be a conductor, further a semiconductor substrate is not limited to that of gallium arsenic compound but a silicon substrate and the like can be used.

Furthermore, the above embodiment have dealt with the case where the insulator layer surface is 0.2 μm thick and the spacing between the primary coil and the secondary coil sandwiching the insulating layer therebetween is approx. 0.2 μm. However, the present invention is not limited to this case and, if the spacing between the primary coil and the secondary coil is set allowably to approx. 1.0 μm, more preferably to 0.3 μm, a large mutual inductance can be obtained.

As described above, according to the present invention, by forming a first flat coil on the semiconductor substrate surface with the pattern wiring of a conductor and forming a second flat coil along the pattern wiring of the first flat coil on the insulator layer surface spaced by an insulator layer having a predetermined thickness with a pattern wiring of any conductor, a transformer of semiconductor device having a large mutual inductance can be implemented and further an amplifier of semiconductor device capable of class-B push-pull performance can be implemented.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A transformer having an inductively coupled primary inductor and secondary inductor formed by integrated circuit techniques on opposite surfaces of an insulating layer formed on a semiconductor substrate, the transformer comprising:

an electrically insulating layer having first and second surfaces thereof;

a primary inductor comprising a spiral-form primary coil formed on one of said first and second surfaces of said insulating layer, a first primary terminal on said one surface connected to a first end of said primary coil on said one surface and a second primary terminal on said one surface connected to a second end of said primary coil on said one surface, at least a portion of said primary coil including a first primary coil through-hole, a primary coil crossover on the other of said first and second surfaces of said insulating layer, and a second primary coil through-hole; and a secondary inductor comprising a spiral-form secondary coil formed on the other of said first and second surfaces of said insulating layer, a first secondary terminal on said other surface connected to a first end of said secondary coil on said other surface and a second secondary terminal on said other surface connected to a second end of said secondary coil on said other surface, at least a portion of said secondary coil including a first secondary coil through-hole, a secondary coil crossover on the one surface of said insulating layer, and a second secondary coil through-hole.

2. The transformer of claim 1, wherein said insulating layer has a thickness that spaces the primary and secondary inductors apart between approximately 0.2 μm and 1.0 μm.

3. The transformer of claim 2, wherein said insulating layer is silicon nitride.

4. A transformer having an inductively coupled primary inductor and secondary inductor formed by integrated circuit techniques on opposite surfaces of an insulating layer formed on a semiconductor substrate, the transformer comprising:

an electrically insulating layer having first and second surfaces thereof;

a primary inductor comprising a spiral-form primary coil formed on one of said first and second surfaces of said insulating layer, a first primary terminal on said one surface connected to a first end of said primary coil on said one surface and a second primary terminal on said one surface connected to a second end of said primary coil on said one surface through a first primary coil through-hole, a primary coil crossover on the other of said first and second surfaces of said insulating layer, and a second primary coil through-hole; and a secondary inductor comprising a spiral-form secondary coil formed on the other of said first and second surfaces of said insulating layer, a first secondary terminal on said other surface connected to a first end of said secondary coil on said other surface and a second secondary terminal on said other surface connected to a second end of said secondary coil on said other surface through a first secondary coil through-hole, a secondary coil crossover on the one surface of said insulating layer, and a second secondary coil through-hole.

5. The transformer of claim 4, wherein said insulating layer has a thickness that spaces the primary and secondary inductors apart between approximately 0.2 μm and 1.0 μm.

6. The transformer of claim 5; wherein said insulating layer is silicon nitride.

7. A transformer having an inductively couple center-tapped primary inductor and a secondary inductor formed by integrated circuit techniques on opposite surfaces of an insulating layer formed on a semiconductor substrate, the transformer comprising:

an electrically insulating layer having first and second surfaces thereof;

a primary inductor comprising a first spiral-form primary sub-coil and a second spiral-form primary sub-coil in series circuit with said first primary sub-coil formed on one of said first and second surfaces of said insulating layer, a first primary terminal on said one surface connected to a first end of said primary inductor on said one surface and a second primary terminal on said one surface connected to a second end of said primary inductor on said one surface, and a center-tap terminal connected to a point intermediate said series-connected first and second primary sub-coils, at least a portion of said primary inductor connected to a primary crossover on the other of said first and second surfaces of said insulating substrate through a first primary coil through-hole and a second primary coil through-hole; and a secondary inductor comprising a spiral-form secondary coil formed on the other of said first and second surfaces of said insulating layer and inductively coupled to said first and second primary sub-coils, a first secondary terminal on said other surface connected to a first end of said secondary coil on said other surface and a second secondary terminal on said other surface connected to a second end of said secondary coil on said other surface, at least a portion of said secondary inductor connected to a secondary cross-over on the one of said first and second surfaces of said insulating, substrate through a first secondary coil through-hole and a second secondary coil through-hole.

8. The transformer of claim 7, wherein said insulating layer has a thickness that spaces the primary and secondary inductors apart between approximately 0.2 μm and 1.0 μm.

9. The transformer of claim 8, wherein said insulating layer is-silicon nitride.

10. An amplifier having a transformer with an inductively coupled center-tapped primary inductor and a secondary inductor formed by integrated circuit techniques on opposite surfaces of an insulating layer formed on a semiconductor substrate, the amplifier comprising:

an electrically insulating layer having first and second surfaces thereof;

a primary inductor comprising a first spiral-form primary sub-coil and a second spiral-form primary sub-coil in series circuit with said first primary sub-coil formed on one of said first and second surfaces of said insulating layer, a first primary terminal on said one surface connected to a first end of said first primary sub-coil on said one surface and a second primary terminal on said one surface connected to a second end of said second primary sub-coil on said one surface, and a center-tap terminal connected to a point intermediate said series-connected first and second primary sub-coils, at least a portion of said primary inductor connected to a primary cross-over on the other of said first and second surfaces of said insulating substrate through a first primary coil through-hole and a second primary coil through-hole;

a secondary inductor comprising a spiral-form secondary coil formed on the other of said first and second surfaces of said insulating layer and inductively coupled to said first and second primary sub-coils, a first secondary terminal on said other surface connected to a first end of said secondary coil on said other surface and a second secondary terminal on said other surface connected to a second end of said secondary coil on said other surface, at least a portion of said secondary inductor connected to a secondary cross-over on the one of said first and second surfaces of said insulating substrate through a first secondary coil through-hole and a second secondary coil through-hole;

first and second field effect transistors having their respective sources connected to ground, the drain of the first field effect transistors connected one of the primary inductor terminals and the drain of the second field effect transistor connected to the other of the primary inductor terminals, the center tap connected to a power source, and a signal input presented to the gates of the first and second field effect transistors.

11. The amplifier of claim 10, further comprising:

a serially connected inductive impedance and capacitive impedance connected between the gates of said first and second field effect transistors.

12. The amplifier of claim 11, further comprising:

an inductive impedance connected between ground and the gate of one of said field effect transistors and a capacitive impedance connected between ground and the gate of the other of said first and second field effect transistors.

* * * * *